United States Patent
Noguchi

(10) Patent No.: US 10,957,377 B2
(45) Date of Patent: Mar. 23, 2021

(54) APPARATUSES AND METHODS FOR DISTRIBUTED TARGETED REFRESH OPERATIONS

(71) Applicant: MICRON TECHNOLOGY, INC., Boise, ID (US)

(72) Inventor: Hidekazu Noguchi, Shinjuku-ku (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/232,837

(22) Filed: Dec. 26, 2018

(65) Prior Publication Data
US 2020/0211632 A1    Jul. 2, 2020

(51) Int. Cl.
G11C 7/00          (2006.01)
G11C 11/406       (2006.01)

(52) U.S. Cl.
CPC ................ G11C 11/40611 (2013.01)

(58) Field of Classification Search
CPC ......... G11C 11/40611; G11C 11/40618; G11C 29/783; G11C 2211/4068
See application file for complete search history.

(56) References Cited

U.S. PATENT DOCUMENTS

| | | |
|---|---|---|
| 5,299,159 A | 3/1994 | Balistreri et al. |
| 5,654,929 A | 8/1997 | Mote, Jr. |
| 5,999,471 A | 12/1999 | Choi |
| 6,002,629 A | 12/1999 | Kim et al. |
| 6,306,721 B1 | 10/2001 | Teo et al. |
| 6,363,024 B1 | 3/2002 | Fibranz |
| 6,392,952 B1 | 5/2002 | Chen et al. |
| 7,002,868 B2 | 2/2006 | Takahashi |
| 7,082,070 B2 | 7/2006 | Hong |
| 7,203,113 B2 | 4/2007 | Takahashi et al. |

(Continued)

FOREIGN PATENT DOCUMENTS

| | | |
|---|---|---|
| CN | 104350546 A | 2/2015 |
| CN | 106710621 A | 5/2017 |

(Continued)

OTHER PUBLICATIONS

U.S. Appl. No. 16/431,641 titled "Apparatuses and Methods for Controlling Steal Rates" filed Jun. 4, 2019.

(Continued)

*Primary Examiner* — Tuan T Nguyen
(74) *Attorney, Agent, or Firm* — Dorsey & Whitney LLP

(57) ABSTRACT

Embodiments of the disclosure are drawn to apparatuses and methods for distributed timing of targeted refresh operations. Information stored in volatile memory cells may decay unless refresh operations are performed. A memory device may perform auto-refresh operations, as well as one or more types of targeted refresh operations, where particular rows are targeted for a refresh. Targeted refresh operations may draw less power than an auto-refresh operation. It may be desirable to distribute targeted refresh operations throughout a sequence of refresh operations, to average out a power draw in the memory device. Responsive to an activation of a refresh signal, the memory device may perform a group of refresh operations. At least one refresh operation in each group may be a targeted refresh operation.

5 Claims, 7 Drawing Sheets

(56) References Cited

U.S. PATENT DOCUMENTS

| | | |
|---|---|---|
| 8,174,921 B2 | 5/2012 | Kim et al. |
| 8,400,805 B2 | 3/2013 | Yoko |
| 8,572,423 B1 | 10/2013 | Isachar et al. |
| 9,236,110 B2 * | 1/2016 | Bains ................ G11C 11/40618 |
| 9,251,885 B2 | 2/2016 | Greenfield et al. |
| 9,299,400 B2 * | 3/2016 | Bains .................... G11C 11/406 |
| 9,406,358 B1 | 8/2016 | Lee |
| 9,653,139 B1 | 5/2017 | Park |
| 9,691,466 B1 | 6/2017 | Kim |
| 9,734,887 B1 | 8/2017 | Tavva |
| 9,761,297 B1 | 9/2017 | Tomishima |
| 9,812,185 B2 | 11/2017 | Fisch et al. |
| 9,818,469 B1 | 11/2017 | Kim et al. |
| 9,865,328 B1 | 1/2018 | Desimone et al. |
| 10,090,038 B2 | 10/2018 | Shin |
| 10,170,174 B1 | 1/2019 | Ito et al. |
| 10,381,327 B2 | 8/2019 | Ramachandra et al. |
| 10,490,250 B1 | 11/2019 | Ito et al. |
| 10,572,377 B1 | 2/2020 | Zhang et al. |
| 10,573,370 B2 | 2/2020 | Ito et al. |
| 10,685,696 B2 | 6/2020 | Brown et al. |
| 2002/0026613 A1 | 2/2002 | Niiro |
| 2003/0161208 A1 | 8/2003 | Nakashima et al. |
| 2003/0231540 A1 | 12/2003 | Lazar et al. |
| 2004/0024955 A1 | 2/2004 | Patel |
| 2005/0002268 A1 | 1/2005 | Otsuka et al. |
| 2005/0108460 A1 | 5/2005 | David |
| 2005/0243627 A1 | 11/2005 | Lee et al. |
| 2005/0265104 A1 | 12/2005 | Remaklus et al. |
| 2006/0215474 A1 | 9/2006 | Hokenmaier |
| 2006/0262617 A1 | 11/2006 | Lee |
| 2006/0268643 A1 | 11/2006 | Schreck et al. |
| 2007/0002651 A1 | 1/2007 | Lee |
| 2007/0028068 A1 | 2/2007 | Golding et al. |
| 2007/0147154 A1 | 6/2007 | Lee |
| 2008/0212386 A1 | 9/2008 | Riho |
| 2008/0224742 A1 | 9/2008 | Pomichter |
| 2008/0306723 A1 | 12/2008 | De Ambroggi et al. |
| 2009/0021999 A1 | 1/2009 | Tanimura et al. |
| 2009/0059641 A1 | 3/2009 | Jeddeloh |
| 2009/0073760 A1 | 3/2009 | Betser et al. |
| 2009/0161468 A1 | 6/2009 | Fujioka |
| 2009/0168571 A1 | 7/2009 | Pyo et al. |
| 2009/0228739 A1 | 9/2009 | Cohen et al. |
| 2009/0296510 A1 | 12/2009 | Lee et al. |
| 2010/0005376 A1 | 1/2010 | Laberge et al. |
| 2010/0097870 A1 | 4/2010 | Kim et al. |
| 2010/0141309 A1 | 6/2010 | Lee |
| 2010/0182863 A1 | 7/2010 | Fukiage |
| 2011/0055495 A1 | 3/2011 | Remaklus, Jr. et al. |
| 2011/0225355 A1 | 9/2011 | Kajigaya |
| 2011/0299352 A1 | 12/2011 | Fujishiro et al. |
| 2012/0014199 A1 | 1/2012 | Narui |
| 2012/0155173 A1 | 6/2012 | Lee et al. |
| 2012/0155206 A1 | 6/2012 | Kodama et al. |
| 2012/0254472 A1 | 10/2012 | Ware et al. |
| 2012/0307582 A1 | 12/2012 | Marumoto et al. |
| 2012/0327734 A1 | 12/2012 | Sato |
| 2013/0028034 A1 | 1/2013 | Fujisawa |
| 2013/0051157 A1 | 2/2013 | Park |
| 2014/0006700 A1 | 1/2014 | Schaefer et al. |
| 2014/0006703 A1 | 1/2014 | Bains et al. |
| 2014/0013169 A1 | 1/2014 | Kobla et al. |
| 2014/0013185 A1 | 1/2014 | Kobla et al. |
| 2014/0016422 A1 | 1/2014 | Kim et al. |
| 2014/0022858 A1 | 1/2014 | Chen et al. |
| 2014/0043888 A1 | 2/2014 | Chen et al. |
| 2014/0095780 A1 | 4/2014 | Bains et al. |
| 2014/0119091 A1 | 5/2014 | You et al. |
| 2014/0143473 A1 | 5/2014 | Kim et al. |
| 2014/0177370 A1 * | 6/2014 | Halbert ............. G11C 11/40603 365/222 |
| 2014/0189228 A1 * | 7/2014 | Greenfield ........ G11C 11/40611 711/106 |
| 2014/0321226 A1 | 10/2014 | Pyeon |
| 2015/0016203 A1 | 1/2015 | Sriramagiri et al. |
| 2015/0049566 A1 | 2/2015 | Lee et al. |
| 2015/0049567 A1 | 2/2015 | Chi |
| 2015/0078112 A1 | 3/2015 | Huang |
| 2015/0092508 A1 | 4/2015 | Bains |
| 2015/0109871 A1 * | 4/2015 | Bains .................... G11C 11/408 365/222 |
| 2015/0213872 A1 | 7/2015 | Mazumder et al. |
| 2015/0294711 A1 | 10/2015 | Gaither et al. |
| 2015/0356048 A1 | 12/2015 | King |
| 2015/0380073 A1 | 12/2015 | Joo et al. |
| 2016/0027498 A1 | 1/2016 | Ware et al. |
| 2016/0070483 A1 | 3/2016 | Yoon et al. |
| 2016/0086649 A1 | 3/2016 | Hong et al. |
| 2016/0180917 A1 | 6/2016 | Chishti et al. |
| 2016/0180921 A1 | 6/2016 | Jeong |
| 2016/0202926 A1 | 7/2016 | Benedict |
| 2016/0225433 A1 | 8/2016 | Bains et al. |
| 2016/0343423 A1 | 11/2016 | Shido |
| 2017/0011792 A1 | 1/2017 | Oh et al. |
| 2017/0052722 A1 | 2/2017 | Ware et al. |
| 2017/0092350 A1 | 3/2017 | Halbert et al. |
| 2017/0111792 A1 | 4/2017 | Correia Fernandes et al. |
| 2017/0133085 A1 | 5/2017 | Kim et al. |
| 2017/0140807 A1 | 5/2017 | Sun et al. |
| 2017/0140810 A1 | 5/2017 | Choi et al. |
| 2017/0140811 A1 | 5/2017 | Joo |
| 2017/0148504 A1 | 5/2017 | Saifuddin et al. |
| 2017/0186481 A1 | 6/2017 | Oh et al. |
| 2017/0269861 A1 | 9/2017 | Lu et al. |
| 2017/0287547 A1 * | 10/2017 | Ito .......................... G11C 29/72 |
| 2017/0345482 A1 | 11/2017 | Balakrishnan |
| 2017/0352404 A1 | 12/2017 | Lee et al. |
| 2018/0005690 A1 | 1/2018 | Morgan et al. |
| 2018/0025772 A1 | 1/2018 | Lee et al. |
| 2018/0025773 A1 | 1/2018 | Bains et al. |
| 2018/0047110 A1 | 2/2018 | Blackman et al. |
| 2018/0061476 A1 | 3/2018 | Kim |
| 2018/0075927 A1 | 3/2018 | Jeong et al. |
| 2018/0096719 A1 | 4/2018 | Tomishima et al. |
| 2018/0108401 A1 | 4/2018 | Choi et al. |
| 2018/0114561 A1 * | 4/2018 | Fisch .................. G11C 29/025 |
| 2018/0114565 A1 | 4/2018 | Lee |
| 2018/0122454 A1 | 5/2018 | Lee et al. |
| 2018/0130506 A1 | 5/2018 | Kang et al. |
| 2018/0158504 A1 | 6/2018 | Akamatsu |
| 2018/0158507 A1 | 6/2018 | Bang |
| 2018/0190340 A1 | 7/2018 | Kim et al. |
| 2018/0218767 A1 | 8/2018 | Wolff |
| 2018/0226119 A1 | 8/2018 | Kim et al. |
| 2018/0233197 A1 | 8/2018 | Laurent |
| 2018/0240511 A1 | 8/2018 | Yoshida et al. |
| 2018/0254078 A1 | 9/2018 | We et al. |
| 2018/0261268 A1 | 9/2018 | Hyun et al. |
| 2018/0294028 A1 | 10/2018 | Lee et al. |
| 2018/0308539 A1 * | 10/2018 | Ito ........................ G11C 29/783 |
| 2019/0043558 A1 | 2/2019 | Suh et al. |
| 2019/0065087 A1 | 2/2019 | Li et al. |
| 2019/0066759 A1 | 2/2019 | Nale |
| 2019/0066766 A1 | 2/2019 | Lee |
| 2019/0088315 A1 | 3/2019 | Saenz et al. |
| 2019/0088316 A1 | 3/2019 | Inuzuka et al. |
| 2019/0122723 A1 | 4/2019 | Ito et al. |
| 2019/0161341 A1 | 5/2019 | Howe |
| 2019/0190341 A1 | 6/2019 | Beisele et al. |
| 2019/0196730 A1 | 6/2019 | Imran |
| 2019/0205253 A1 | 7/2019 | Roberts |
| 2019/0252020 A1 | 8/2019 | Rios et al. |
| 2019/0279706 A1 | 9/2019 | Kim |
| 2019/0333573 A1 * | 10/2019 | Shin ...................... G11C 11/408 |
| 2019/0362774 A1 | 11/2019 | Kuramori et al. |
| 2019/0385661 A1 | 12/2019 | Koo et al. |
| 2019/0385667 A1 | 12/2019 | Morohashi et al. |
| 2019/0385668 A1 | 12/2019 | Fujioka et al. |
| 2019/0391760 A1 | 12/2019 | Miura et al. |
| 2019/0392886 A1 | 12/2019 | Cox et al. |
| 2020/0051616 A1 | 2/2020 | Cho |
| 2020/0075086 A1 | 3/2020 | Hou et al. |
| 2020/0082873 A1 | 3/2020 | Wolff |

(56) References Cited

U.S. PATENT DOCUMENTS

| | | | |
|---|---|---|---|
| 2020/0126611 | A1 | 4/2020 | Riho et al. |
| 2020/0135263 | A1 | 4/2020 | Brown et al. |
| 2020/0143871 | A1 | 5/2020 | Kim et al. |
| 2020/0176050 | A1 | 6/2020 | Ito et al. |
| 2020/0194056 | A1 | 6/2020 | Sakurai et al. |
| 2020/0210278 | A1 | 7/2020 | Rooney et al. |
| 2020/0211633 | A1* | 7/2020 | Okuma ............ G11C 11/40611 |
| 2020/0219555 | A1 | 7/2020 | Rehmeyer |
| 2020/0265888 | A1 | 8/2020 | Ito et al. |
| 2020/0273517 | A1 | 8/2020 | Yamamoto |
| 2020/0273518 | A1 | 8/2020 | Raad et al. |
| 2020/0279599 | A1 | 9/2020 | Ware et al. |
| 2020/0294569 | A1 | 9/2020 | Wu et al. |
| 2020/0294576 | A1 | 9/2020 | Brown et al. |
| 2020/0321049 | A1 | 10/2020 | Meier et al. |

FOREIGN PATENT DOCUMENTS

| | | |
|---|---|---|
| CN | 107871516 A | 4/2018 |
| JP | 4911510 B2 | 1/2012 |
| JP | 6281030 B1 | 1/2018 |

OTHER PUBLICATIONS

U.S. Appl. No. 15/881,256 entitled 'Apparatuses and Methods for Detecting a Row Hammer Attack With a Bandpass Filter' filed Jan. 26, 2018.

U.S. Appl. No. 15/789,897, entitled "Apparatus and Methods for Refreshing Memory", filed Oct. 20, 2017; pp. all.

U.S. Appl. No. 15/796,340, entitled: "Apparatus and Methods for Refreshing Memory" filed Oct. 27, 2017; pp. all.

U.S. Appl. No. 16/012,679, titled "Apparatuses and Methods for Multiple Row Hammer Refresh Address Sequences", filed Jun. 19, 2018.

U.S. Appl. No. 16/025,844, titled "Apparatus and Methods for Triggering Row Hammer Address Sampling", filed Jul. 2, 2018.

U.S. Appl. No. 16/084,119, titled "Apparatuses and Methods for Pure-Time, Self Adopt Sampling for Row Hammer Refresh Sampling", filed Sep. 11, 2018.

U.S. Appl. No. 16/176,932, titled "Apparatuses and Methods for Access Based Refresh Timing", filed Oct. 31, 2018.

U.S. Appl. No. 16/230,300, titled "Apparatuses and Methods for Staggered Timing of Targeted Refresh Operations" filed Dec. 21, 2018.

U.S. Appl. No. 16/237,291, titled "Apparatus and Methods for Refreshing Memory", filed Dec. 31, 2018.

U.S. Appl. No. 16/286,187 titled "Apparatuses and Methods for Memory Mat Refresh Sequencing" filed Feb. 26, 2019.

U.S. Appl. No. 16/290,730, titled "Semiconductor Device Performing Row Hammer Refresh Operation" filed Mar. 1, 2019.

U.S. Appl. No. 16/374,623, titled "Semiconductor Device Performing Row Hammer Refresh Operation", filed Apr. 3, 2019.

U.S. Appl. No. 16/375,716 titled "Stagger RHR Pumping Scheme Across Die Banks" filed Apr. 4, 2019; pp. all.

U.S. Appl. No. 15/876,566 entitled 'Apparatuses and Methods for Calculating Row Hammer Refresh Addresses in a Semiconductor Device' filed Jan. 22, 2018.

PCT Application No. PCT/US18/55821 "Apparatus and Methods for Refreshing Memory" filed Oct. 15, 2018., pp. all.

U.S. Appl. No. 16/783,063, titled "Apparatus and Methods for Triggering Row Hammer Address Sampling", dated Feb. 5, 2020.

U.S. Appl. No. 16/655,110 titled "Apparatuses and Methods for Dynamic Targeted Refresh Steals" filed Oct. 16, 2019.

U.S. Appl. No. 16/549,411 titled "Apparatuses and Methods for Dynamic Refresh Allocation" filed Aug. 23, 2019.

U.S. Appl. No. 16/537,981 titled "Apparatuses and Methods for Controlling Targeted Refresh Rates" filed Aug. 12, 2019.

U.S. Appl. No. 16/682,606, titled "Apparatuses And Methods For Distributing Row Hammer Refresh Events Across A Memory Device ", filed Nov. 13, 2019.

U.S. Appl. No. 16/788,657, titled "Semiconductor Device Performing Row Hammer Refresh Operation", dated Feb. 12, 2020.

U.S. Appl. No. 16/818,989, titled "Semiconductor Device Performing Row Hammer Refresh Operation", dated Mar. 13, 2020.

U.S. Appl. No. 16/818,981 titled "Apparatuses and Methods for Staggered Timing of Targeted Refresh Operations" filed Mar. 13, 2020.

U.S. Appl. No. 16/208,217, titled "Semiconductor Device Performing Row Hammer Refresh Operation", filed Dec. 3, 2018.

U.S. Appl. No. 16/824,460, titled "Semiconductor Device Performing Row Hammer Refresh Operation", dated Mar. 19, 2020.

U.S. Appl. No. 16/886,284, titled "Apparatuses and Methods for Access Based Refresh Timing", dated May 28, 2020.

U.S. Appl. No. 17/008,396 titled "Apparatuses and Methods for Staggered Timing of Targeted Refresh Operations" filed Aug. 31, 2020.

U.S. Appl. No. 16/997,766 titled "Refresh Logic Circuit Layouts Thereof" filed Aug. 19, 2020.

U.S. Appl. No. 17/095,978 titled "Apparatuses and Methods for Controlling Refresh Timing" filed Nov. 12, 2020.

U.S. Appl. No. 17/030,018, titled "Apparatuses and Methods for Controlling Refresh Operations", filed Sep. 23, 2020, pp. all.

* cited by examiner

APPARATUSES AND METHODS FOR DISTRIBUTED TARGETED REFRESH OPERATIONS

BACKGROUND

Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. An auto-refresh operation may be carried out where a sequence of memory cells are periodically refreshed. Repeated access to a particular memory cell or group of memory cells (often referred to as a 'row hammer') may cause an increased rate of data degradation in nearby memory cells. It may be desirable to identify and refresh memory cells affected by the row hammer in a targeted refresh operation in addition to the auto-refresh operation. The targeted refresh operations may occur with timing interspersed between the auto-refresh operations.

DETAILED DESCRIPTION

Figure 1:
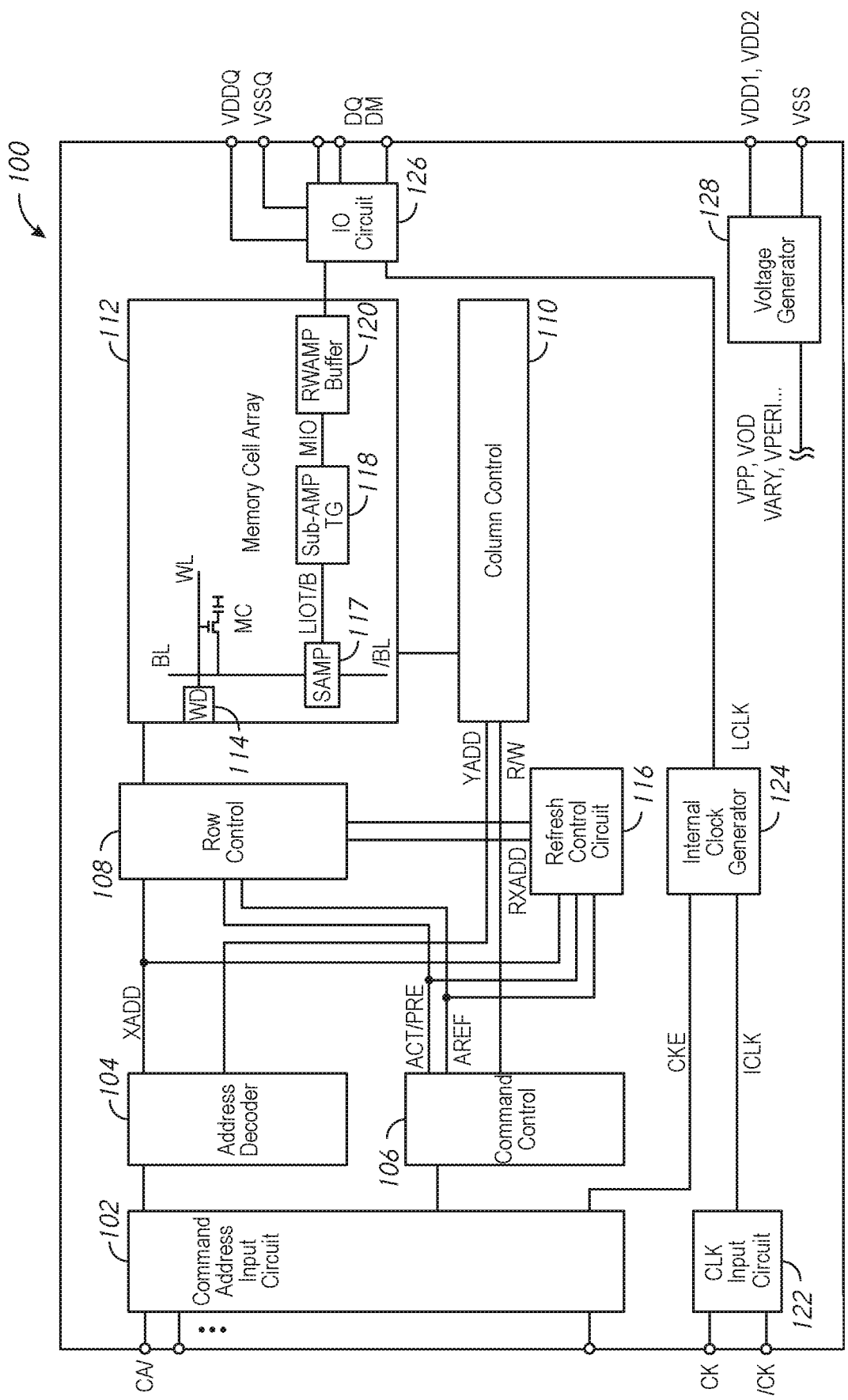
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in the memory cells may decay over time. The memory cells may be refreshed on a row-by-row basis. During a refresh operation, the information in one or more rows may be read out and then written back to the respective rows. A refresh signal (such as auto-refresh signal AREF) may control a timing of the refresh operations. In some embodiments, the memory device may generate one or more "pumps", which may be activations of an internal refresh signal responsive to receiving an activation of the refresh signal. The memory device may perform a refresh operation responsive to the pumps (and/or the refresh signal). The memory device may be perform more than one type of refresh operation, and at each pump may determine which type of refresh operation to perform and may refresh one or more wordlines based on the type of the refresh operation.

One type of refresh operation may be an auto-refresh operation. In an auto-refresh operation, the memory device may refresh a group of wordlines from a sequence of wordlines, and then during a next auto-refresh operation may refresh the next group of wordlines in the sequence. Over time, the memory device may carry out auto-refresh operations to cycle through the different rows of the memory in order to prevent data loss. In some embodiments, the memory device may refresh each row of the memory device, and may cycle through the rows with a timing based on a normal rate of data degradation in the memory cells (e.g., so that each row is refreshed more frequently than an expected time it would take for data loss in that row).

Another type of refresh operation may be a targeted refresh operations. Repeated access to a particular row of memory (which may generally be referred to as an aggressor row) may cause an increased rate of decay in neighboring rows (which may generally be referred to as victim rows) due, for example, to electromagnetic coupling between the rows. Information in the victim rows may decay at a rate such that data may be lost if they aren't refreshed before the next auto-refresh operation of that row. In order to prevent information from being lost, it may be necessary to identify aggressor rows and then carry out a targeted refresh operation where one or more associated victim rows can be refreshed. In some embodiments, the targeted refresh operation may "steal" a timeslot (e.g., an activation of a pump, an activation of the auto-refresh signal) which would have otherwise been used for an auto-refresh operation.

It may be important to control an amount of current drawn by the memory device during refresh operations. An auto-refresh operation may draw more current than a targeted refresh operation, since more rows may be refreshed during a given auto-refresh operation than are refreshed during a given targeted refresh operation. It may be desirable to control the timing of targeted refresh and auto-refresh operations in order to 'average out' the power drawn by a sequence of refresh operations.

The present disclosure is drawn to apparatuses, systems, and methods for distributed targeted refresh operations. Rather than perform a block of auto-refresh operations and a then a block of targeted refresh operations, a memory device may distribute targeted refresh operations so that there is a more even power load over time. In some embodiments, the memory device may provide activations of a refresh signal, and may perform a plurality of refresh operations responsive to each activation of the refresh signal. At least one of the plurality of refresh operations associated with each activation of the refresh signal may be a targeted refresh operation. In some embodiments, the number of targeted refresh operations may change between different activations of the refresh signal.

In some embodiments, the memory device may determine a first victim row and a second victim row associated with a given aggressor row. The memory device may refresh the first victim row, and may then perform at least one other refresh operation before refreshing the second victim row. In some embodiments, the first victim row may be refreshed responsive to a pump associated with a first refresh signal, while the second victim row may be refreshed responsive to a pump associated with a second refresh signal. In some embodiments, the memory device may perform one or more auto-refresh operations between targeted refresh operations, in some embodiments, there may be more than one type of targeted refresh operation, and the memory may perform one or more targeted refresh operations of a different type between targeted refresh operations of the first type.

FIG. 1 is a block diagram of a semiconductor device according to at least one embodiment of the disclosure. The semiconductor device 100 may be a semiconductor memory device, such as a DRAM device integrated on a single semiconductor chip.

The semiconductor device 100 includes a memory array 112. In some embodiments, the memory array 112 may include of a plurality of memory banks. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row control 108 and the selection of the bit lines BL and /BL, is performed by a column control 110. The bit lines BL and /BL are coupled to a respective sense amplifier (SAMP). Read data from the bit line BL or /BL is amplified by the sense amplifier SAMP 117, and transferred to read/write amplifiers 120 over complementary local data lines (LIOT/B), transfer gate (TG) 118, and complementary main data lines (MIOT/B). Conversely, write data outputted from the read/write amplifiers 120 is transferred to the sense amplifier 117 over the complementary main data lines MIOT/B, the transfer gate 118, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to a clock input circuit 122. The external clocks may be complementary. The clock input circuit 122 generates an internal clock ICLK based on the CK and /CK clocks, The ICLK clock is provided to the command control 106 and to an internal clock generator 124. The internal clock generator 124 provides various internal clocks LCLK based on the ICLK clock. The LCLK clocks may be used for timing operation of various internal circuits. The internal data clocks LCLK are provided to the input/output circuit 126 to time operation of circuits included in the input/output circuit 126, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row control 108 and supplies a decoded column address YADD to the column control 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YARD, and bank address BADD to indicate the memory cell(s) to be accessed.

The commands may be provided as internal command signals to a command control 106 via the command/address input circuit 102. The command control 106 includes circuits to decode the internal command signals to generate various internal signals and commands for performing operations. For example, the command control 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address and a column address are timely supplied with the read command, read data is read from memory cells in the memory array 112 corresponding to the row address and column address. The read command is received by the command control 106, which provides internal commands so that read data from the memory array 112 is provided to the read/write amplifiers 120. The read data is output to outside from the data terminals DQ via the input/output circuit 126.

The device 100 may receive an access command which is a write command. When the write command is received, a bank address and a column address are timely supplied with the write command, write data supplied to the data terminals DQ is written to a memory cells in the memory array 112 corresponding to the row address and column address. The write command is received by the command control 106, which provides internal commands so that the write data is received by data receivers in the input/output circuit 126. Write clocks may also be provided to the external clock terminals for timing the receipt of the write data by the data receivers of the input/output circuit 126. The write data is supplied via the input/output circuit 126 to the read/write amplifiers 120, and by the read/write amplifiers 120 to the memory array 112 to be written into the memory cell MC.

The device 100 may also receive commands causing it to carry out refresh operations. The refresh signal AREF may be a pulse signal which is activated when the command control 106 receives a signal which indicates a refresh mode. In some embodiments, the refresh command may be externally issued to the memory device 100. In some embodiments, the refresh command may be periodically generated by a component of the device. In some embodiments, when an external signal indicates a refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh control circuit 116. The refresh control circuit 116 supplies a refresh row address RXADD to the row control 108, which may refresh a wordline WL indicated by the refresh row address RXADD. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses), or may operate based on internal logic.

The refresh control circuit 116 may selectively output a targeted refresh address (e.g., a victim address) or automatic refresh addresses (auto-refresh address) as the refreshing address RXADD. The automatic refresh addresses may be a group of addresses from a sequence of addresses of the memory array 118, The refresh control circuit 116 may cycle through the sequence of auto-refresh addresses at a rate determined by AREF.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 112. The refresh control circuit 116 may selectively use one or more signals of the device 100 to calculate the targeted refresh address RXADD. For example, the refresh address RXADD may be a calculated based on the row addresses XADD provided by the address decoder. The refresh control circuit 116 may sample the current value of the row address XADD provided by the address decoder 104 and determine a targeted refresh address based on one or more of the sampled addresses.

The targeted refresh address may be based on characteristics over time of the row addresses XADD received from the address decoder 104. The refresh control circuit 116 may sample the current row address XADD to determine its characteristics over time. The sampling may occur intermittently, with each sample acquired based on a random or semi-random timing. The refresh control circuit 116 may use different methods to calculate a targeted refresh address based on the sampled row address XADD. For example, the refresh control circuit 116 may determine if a given row is an aggressor address, and then calculate and provide addresses corresponding to victim addresses of the aggressor address as the targeted refresh address. In some embodiments, more than one victim address may correspond to a given aggressor address. In this case the refresh control circuit may queue up multiple targeted refresh addresses, and provide them sequentially when it determines that a targeted refresh address should be provided. The refresh control circuit 116 may provide the targeted refresh address right away, or may queue up the targeted refresh address to be provided at a later time (e.g., in the next time slot available for a targeted refresh).

The refresh address RXADD may be provided with a timing based on a timing of the refresh signal AREF. The refresh control circuit 116 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto-refresh address. In some embodiments, certain time slots may be reserved for targeted refresh addresses, and the refresh control circuit 116 may determine whether to provide a targeted refresh address, not provide an address during that time slot, or provide an auto-refresh address instead during the time slot.

For example, the refresh control circuit 116 may provide one or more refresh pump signals responsive to each activation of the refresh signal AREF. In some embodiments, the refresh control circuit 116 may provide a group of a set number of refresh pumps (e.g., activations of the refresh pump signal) for each activation of AREF. For example, the refresh control circuit 116 may provide five pumps for each activation of AREF, although more or less pumps may be used in other examples. Each pump may be associated with a refresh operation (e.g., either an auto-refresh operation or a targeted refresh operation) and the row control 108 may perform a refresh operation based on the refresh address RXADD each time the refresh pump signal is activated. In some embodiments, there may be a targeted refresh operation in each group of refresh pumps (e.g., there may be at least one targeted refresh operation responsive to each activation of AREF). In some embodiments, the number of targeted refresh operations may change between different groups of refresh pumps. For example, there may be different numbers of targeted refresh operations responsive to even and odd activations of AREF.

In some embodiments, the refresh control circuit 116 may perform more than one type of targeted refresh operation. The refresh control circuit 116 may use internal logic to determine when to perform the second type of targeted refresh operation. In some embodiments, the refresh control circuit 116 may count a number of activations of AREF, and may determine when to perform the second type of targeted refresh operation based on the count of AREF. For example, in some embodiments the refresh control circuit 116 may perform auto-refresh operations and the first and second type of targeted refresh operation for some number of activations of AREF (e.g., 4) and then may perform auto-refresh operations and the first type of targeted refresh operation for some number of activations of AREF (e.g., 8).

The power supply terminals are supplied with power supply potentials VDD and VSS. The power supply potentials VDD and VSS are supplied to an internal voltage generator circuit 128. The internal voltage generator circuit 128 generates various internal potentials VPP, VOD, VARY, VPERI, and the like based on the power supply potentials VDD and VSS supplied to the power supply terminals. The internal potential VPP is mainly used in the row control 108, the internal potentials VOD and VARY are mainly used in the sense amplifiers SAMP included in the memory array 112, and the internal potential VPERI is used in many peripheral circuit blocks.

The power supply terminals are also supplied with power supply potentials VDDQ and VSSQ. The power supply potentials VDDQ and VSSQ are supplied to the input/output circuit 126. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 126 so that power supply noise generated by the input/output circuit 126 does not propagate to the other circuit blocks.

Figure 2:
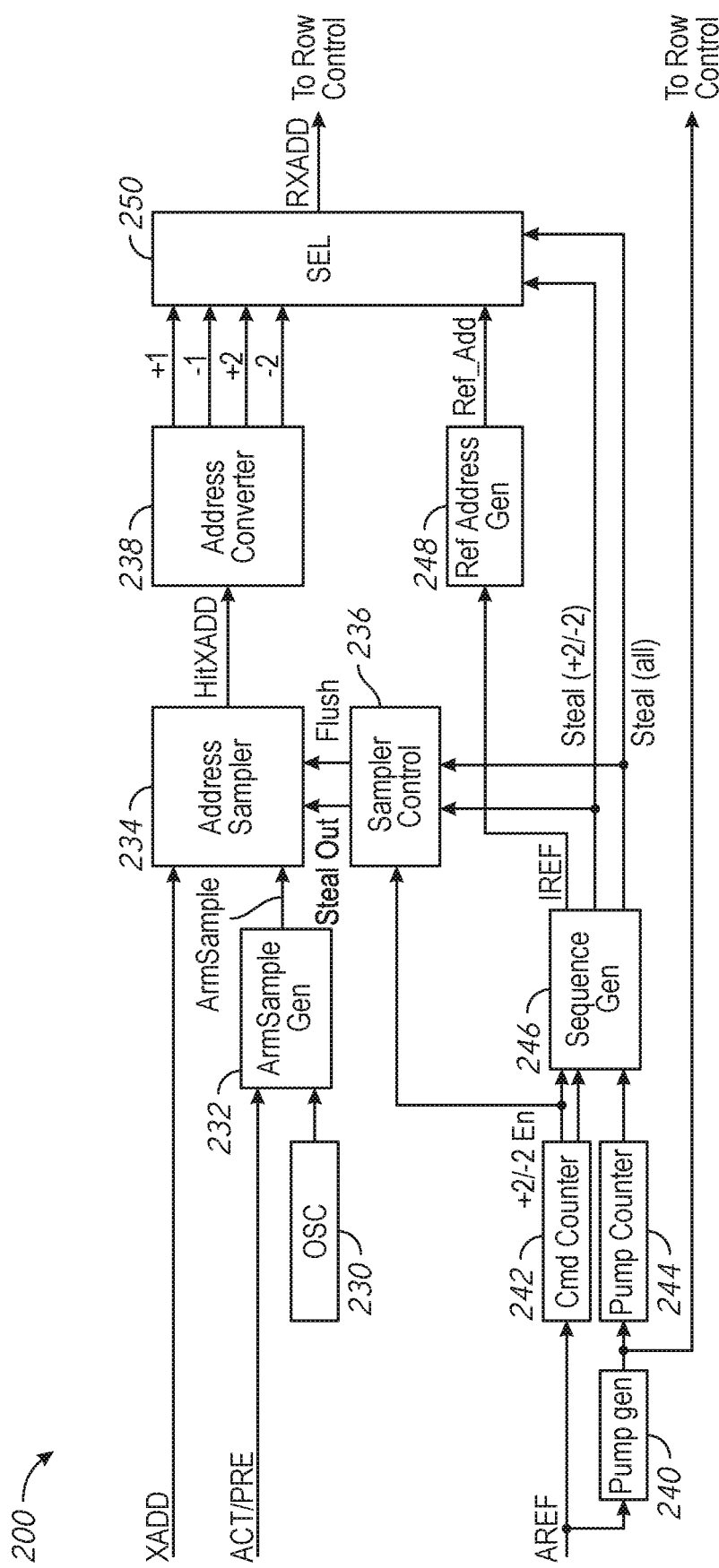
FIG. 2 is a block diagram of a refresh control circuit according to an embodiment of the present disclosure.

FIG. 2 is a block diagram of a refresh control circuit according to an embodiment of the present disclosure. In some embodiments, the refresh control circuit 200 may be used to implement the refresh control circuit 116 of FIG. 1. The refresh control circuit 200 may provide a refresh address RXADD to a row control (e.g., row control 108 of FIG. 1). The refresh control circuit 200 may use internal logic to determine if the provided refresh address RXADD indicates a victim row associated with an aggressor row as part of a targeted refresh address or if the refresh address RXADD indicates a group of auto-refresh addresses as part of an auto-refresh operation. The refresh control circuit 200 may also identify aggressor rows and may control the timing of refresh operations based on the timing of the refresh signal AREF.

The refresh control circuit 200 represents a particular example embodiment. In the example of FIG. 2, the refresh control circuit 200 is capable of performing two different types of targeted refresh operations. In a first type of targeted refresh operations, a pair of victim rows are identified which are physically adjacent to the aggressor row. These victim rows may generally be referred to as +1 and −1 victim rows. In a second type of targeted refresh operation, the refresh control circuit 200 identifies a pair of victim rows which are adjacent to the adjacent rows, which may generally be referred to as +2 and −2 victim rows. Accordingly, the +1 row is between the aggressor row and the +2 row, and the −1 row is between the aggressor row and the −2 row. The refresh control circuit 200 also provides a plurality of "pumps" responsive to each activation of the refresh signal AREF. The pumps may control the timing of refresh operations, and a refresh address RXADD may be provided and refreshed with each pump. Other refresh control circuits in other embodiments may, for example, perform more or less types of targeted refresh operations, and/or may include targeted refresh operations where the victim rows have a different relationship to the aggressor row.

The refresh control circuit 200 includes an address sampler 234 which determines if a row address XADD is an aggressor address. The address sampler 234 may 'sample' the value of XADD responsive to a sampling signal provided by a sampling signal generator 232. The sampling signal generator 232 may provide a sampling signal ArmSample with timing which may be based in part on an oscillator 230 and the ACT/PRE signal of the memory. The address sampler 234 provides an identified aggressor address to an address converter 238, which determines victim rows based on the identified aggressor address and provides them to selector 250. The refresh control circuit 200 also includes a pump generator 240, which generates a number of pump signals responsive to the refresh signal REF and provides them to the row control (e.g., row control 108 of FIG. 1) and to a pump counter 244 which counts the pumps and provides that count to a sequence generator 246. The refresh signal REF is also provided to a command counter 242, which provides a +2/−2 En signal to a sampler control circuit 236 and to the sequence generator 246 and a count value to the sequence generator 246. Based on +2/−2 En, the count value and the count of pumps, the sequence generator 246 provides an internal refresh signal IREF, and a first and second steal command Steal(all) and Steal(+2/−2) respectively. The internal refresh command IREF is provided to a reference address generator 248 which provides auto-refresh addresses to the selector 250. The sampler control circuit 236 provides the signal Steal out which causes the address sampler 234 to provide an aggressor address to the address converter 238. The signal Steal out is provided based on the +2/−2 En signal, and the steal signals Steal(all) and Steal(+2/−2). The selector 250 provides the refresh address RXADD based on the steal signals Steal(all) and Steal(+2/−2).

The refresh control circuit 200 receives the row address XADD (e.g., from address decoder 104) and an activation and/or pre-charge signal ACT/PRE (e.g., from the command control 106). These may be used, in part, to determine if a given row specified by XADD is an aggressor row. The value of XADD may change over time as the memory performs operations (such as access operations) on different wordlines of the memory. The address sampler 234 may 'sample' a current value of the row address XADD when the sampling signal ArmSample is activated. Based on the values of one or more sampled address(es), the address sampler 234 may provide an aggressor address HitXADD to the address converter 238.

The sampling signal generator 232 provides activations of the sampling signal ArmSample to the address sampler 234. In some embodiments, the sampling signal generator 232 may provide the sampling signal ArmSample with regular timing. In some embodiments, the sampling signal generator 232 may provide activations of ArmSample with random, semi-random, and/or pseudo-random timing. In some embodiments, the timing at which ArmSample is provided may be influenced by one or more additional signals. For example, in the particular refresh control circuit 200 of FIG. 2, the sampling signal generator 232 may semi-randomly provide activations of ArmSample based on a timing signal provided by the oscillator 230 and the ACT/PRE signals.

In the example embodiment of FIG. 2, the address sampler 234 may be a content addressable memory (CAM) sampler, and may store a number of sampled addresses. As described in more detail in FIG. 3, when the address sampler 234 receives the signal Steal out from the sampler control circuit 236, the address sampler 234 may provide an address as the aggressor address HitXADD. The address converter 238 may receive the aggressor address HitXADD and provide the addresses of victim rows associated with the provided aggressor address. The address converter 238 may determine the address of victim rows based on a physical relationship between the victim rows and the row associated with the aggressor address. In the embodiment of FIG. 2, the address converter provides two pairs of victim addresses, +1 and −1 which are adjacent to the aggressor row, and +2 and −2, which are adjacent to +1 and −1 respectively.

The pump generator 240 receives the refresh signal AREF, and provides a plurality of activations of a pump signal in response. For example, the pump generator 240 may provide five activations of the pump signal in response to each activation of AREF. More or less pumps may be provided in other examples. The activations of the pump signal are provided to the row control (e.g., row control 108 of FIG. 1) and the row control may perform a refresh operation on the refresh address RXADD each time the pump signal is activated. Accordingly, responsive to each activation of AREF, a number (in this example, five) of refresh operations are performed.

The command counter 242 counts a number of activations of the refresh signal REF, while the pump counter 244 counts a number of activations of the refresh pump signal. The command counter 242 provides the signal +2/−2 En based on the number of activations of the refresh signal AREF. In some embodiments, +2/−2 En may be provided at an active level responsive to the first four activations of AREF out of a group of 16, or +2/−2 En may be provided as one shot pulse to control the first four activations of AREF out of a group of 16. Thus, +2/−2. En may be active for four activations of AREF and then inactive for twelve activations of AREF. The cycle may then repeat. Other timings of the activations of +2/−2 En may be used in other examples.

The pump counter 244 may count a number of activations of the refresh pump signal provided by the pump generator 240, and may provide that count to the sequence generator 246. Each time the pump signal is activated by the pump generator 240, the pump counter 244 may increment a value of a pump count. In some embodiments, the pump counter 244 may provide a signal which indicates a value of the pump count to the sequence generator 246. In some embodiments, the pump counter 244 may provide a signal which may be active when the pump count is at a certain value (or values). For example, the pump counter 244 may have a maximum value, and may reset to a minimum value and provide a signal when the maximum value is exceeded.

The sequence generator 246 determines if a given activation of the pump signal will be associated with an auto-refresh operation, a first type of targeted refresh operation (e.g., a +1/−1 operation), or a second type of targeted refresh operation (e.g., a +2/−2 operation), The sequence generator 246 receives the pump count from the pump counter 244 and the +2/−2 En signal from the command counter 242. Based on the states of these inputs, the sequence generator 246 provides one or more signals which indicate a type of refresh operation that should be performed. The sequence generator 246 may provide the internal refresh signal IREF to indicate that an auto-refresh operation should be performed. The sequence generator 246 may provide the Steal (all) signal to indicate that a targeted refresh operation should be performed (e.g., either a first type of targeted refresh operation or a second type of targeted refresh operation). The sequence generator 246 may provide the Steal (+2/−2) signal to indicate that the second type of targeted refresh operation should be performed. Accordingly, the signals Steal (all) and Steal(+/−2) both being active may indicate that the second type of targeted refresh operation should occur, while Steal (all) being active and Steal (+2/−2) being inactive may indicate that the first type of targeted refresh operation should occur.

The refresh address generator 248 provides an auto refresh address (or group of auto-refresh addresses) Ref_Add responsive to an activation of the internal refresh signal IREF. In some embodiments, Ref_Add may be a signal which represents a block of addresses to be refreshed. The refresh address generator 248 may have a sequence of memory addresses, and may provide a next group of addresses from the sequence each time the internal refresh signal IREF is activated. In some embodiments, the refresh address generator 248 may comprise a refresh address counter, and may count through a list of refresh addresses each time the signal IREF is activated.

The selector 250 provides either the auto-refresh address (es) Ref_Add, or one of the targeted refresh addresses +1, −1, +2, or −2 as the refresh address RXADD. The selector 260 provides an address based on the states of the signals Steal (all) and Steal (+2/−2). For example, if both Steal (all) and Steal (+2/−2) are inactive, the selector may provide the auto-refresh addresses Ref_Add as the refresh address RXADD, and an auto-refresh operation may be performed on the addresses indicated by Ref_Add. If Steal (all) is active but Steal (+2/−2) is inactive, the selector 250 may provide the +1 and −1 addresses as the refresh address RXADD a first type of targeted refresh operation may be performed on the addresses indicated by +1 and −1. In some embodiments, a first time that steal signals indicate the first type of targeted refresh operation, +1 may be provided as the refresh address RXADD, and a next time that the steal signals indicate the first type of targeted refresh operation, −1 may be provided as the refresh address RXADD. When both Steal (+2/−2) and Steal (all) are active, the second type of targeted refresh operation may be performed in a manner similar to the first type of targeted refresh operation.

The sampler control circuit 236 may provide the steal out signal to the address sampler 234 to indicate that that a new aggressor address HitXADD should be provided by the address sampler 234. As described in more detail in FIG. 3, the address sampler 234 may store a plurality of potential aggressor addresses. Responsive to the signal Steal out, the address sampler 234 may provide one of the stored addresses as the aggressor address HitXADD, and the address converter 238 may determine the addresses +1, −1, +2, and −2 based on the provided aggressor address HitXADD.

The sampler control circuit 236 may provide the signal Flush after all victim addresses for a given identified aggressor address HitXADD have been refreshed. In some embodiments, the sampler control circuit 236 may provide the signal Flush responsive to the states of +2/−2 En, Steal (+2/−2), and Steal (all). In some embodiments, the signal +2/−2 En being in an active state may indicate that the second type (e.g., +2 and −2) of targeted refresh operation should be performed instead of the first type (e.g., +1 and −1) of targeted refresh operation. In some embodiments, the signal +2/−2 En being active may indicate that both the first type (e.g., +1 and −1) and the second type (e.g., +2 and −2) of targeted refresh operations should be performed on a given aggressor address. For example, when +2/−2 En is active, the signal Flush may be provided after each of +1, −1, +2, and −2 for a given aggressor address HitXADD have been provided by the selector 250 as the refresh address RXADD. For example, in some embodiments, when +2/−2 En is active, the signal Flush may be provided after four activations of Steal(all). In some embodiments, when +2/−2 En is active, the signal Flush may be provided upon a second activation of Steal (+2/−2) (e.g., on every other activation of Steal(+2/−2)). When the signal +2/−2 En is not active, the refresh control circuit 200 may only perform the first type of targeted refresh operation and so the signal Flush may be provided after both +1 and −1 for a given aggressor address HitXADD have been provided by the selector 250 as the refresh address RXADD. In some embodiments, when +2/−2 En is inactive, the sampler control circuit 236 may provide Flush after two activations of Steal(all).

Figure 3:
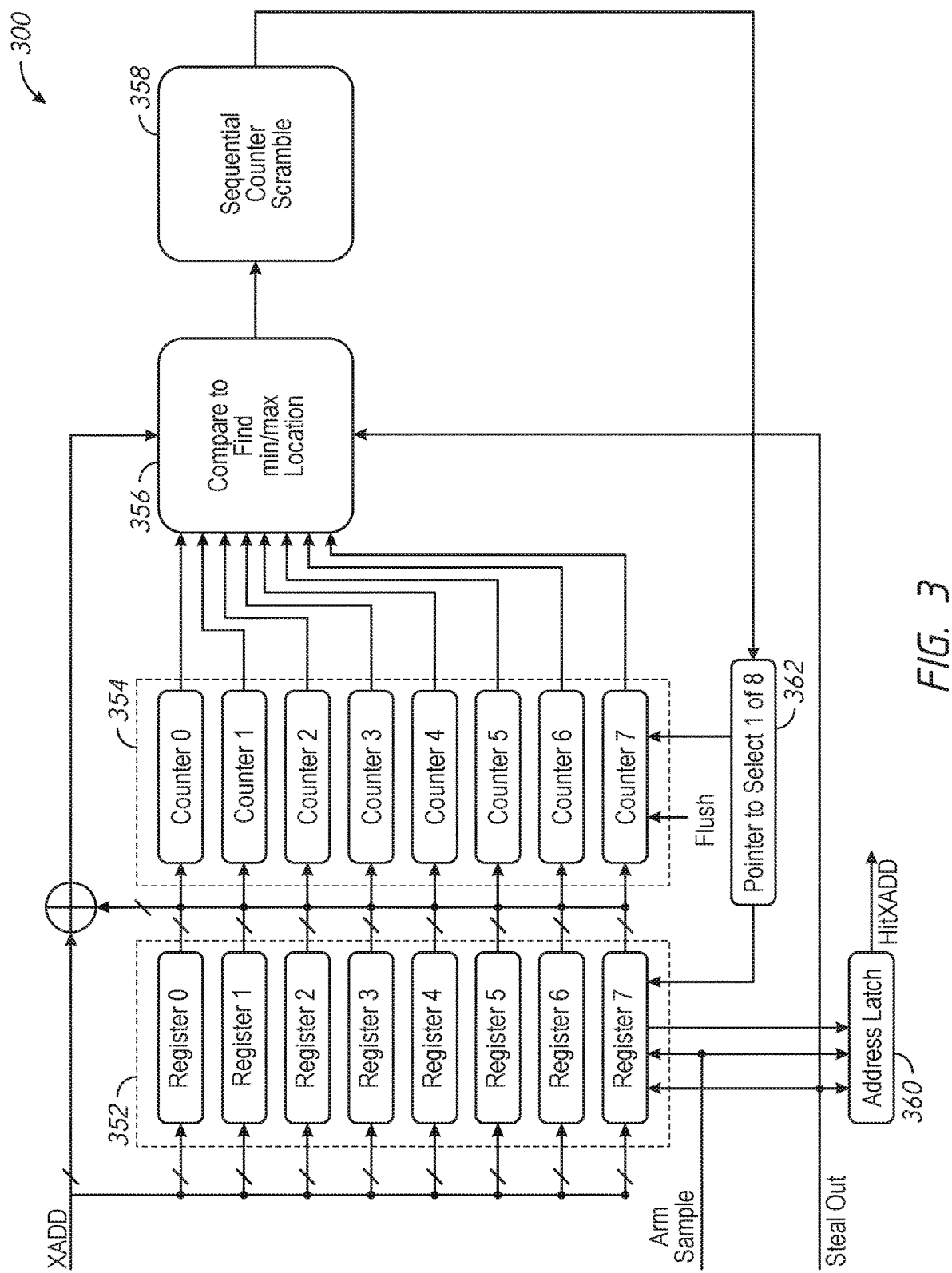
FIG. 3 is a block diagram of an address sampler according to an embodiment of the present disclosure.

FIG. 3 is a block diagram of an address sampler according to an embodiment of the present disclosure. In some embodiments, the address sampler 300 may be used to implement the address sampler 234 of FIG. 2. The particular embodiment of the address sampler 300 may be a content addressable memory (CAM) address sampler. The address sampler 300 may include a series of registers 352, each of which may have a corresponding counter 354. The counters 354 may be coupled to a comparator 356 which may be coupled to a pointer 362 through a counter scrambler 358. The registers 352 may be coupled to an address latch 360, which may store and provide an identified row hammer address as the match address HitXADD.

The address sampler 300 may sample a current row address XADD responsive to the sample signal ArmSample. The signal Steal out may cause the address sampler 300 to determine if a sampled address (e.g., an address stored in one of the registers 352) is a row hammer address and store it on the address latch 360, where it can be provided to a refresh address generator (e.g., refresh address converter 238 of FIG. 2) as the match address HitXADD.

Each time the sample signal ArmSample is provided, the current row address XADD may be compared to the registers 352. If the current address XADD is already stored in one of the registers, then the counter 354 associated with that register 352 may be incremented. If the current address XADD is not already stored in one of the registers 352, it may be added to the registers 352. If there is an open register (e.g., a register without a latched address) then the sampled address XADD may be stored in the open register. If there is not an open register, then the register associated with the counter 354 which has the lowest value (as indicated by the pointer 362) may have its latched address replaced with the sampled address XADD.

The Steal out signal may cause the comparator 356 to determine a counter 354 with a maximum and minimum value. These may be provided to a counter scrambler 358, which may match the maximum and minimum counter 354 to their respective associated registers 352. The pointer 362 may point to the register 352 associated with the maximum value of count in the counters 354 and may point to the register 352 associated with the minimum value of count in the counters 354. The minimum pointer may be used to overwrite a register 352 when a new address XADD is sampled and there is no open register 352 to store it in. The signal Flush may cause the counter 354 associated with the address currently stored in the latch 360 to be reset. The address stored in the address latch 360 may be provided as the match address HitXADD.

Figure 4:
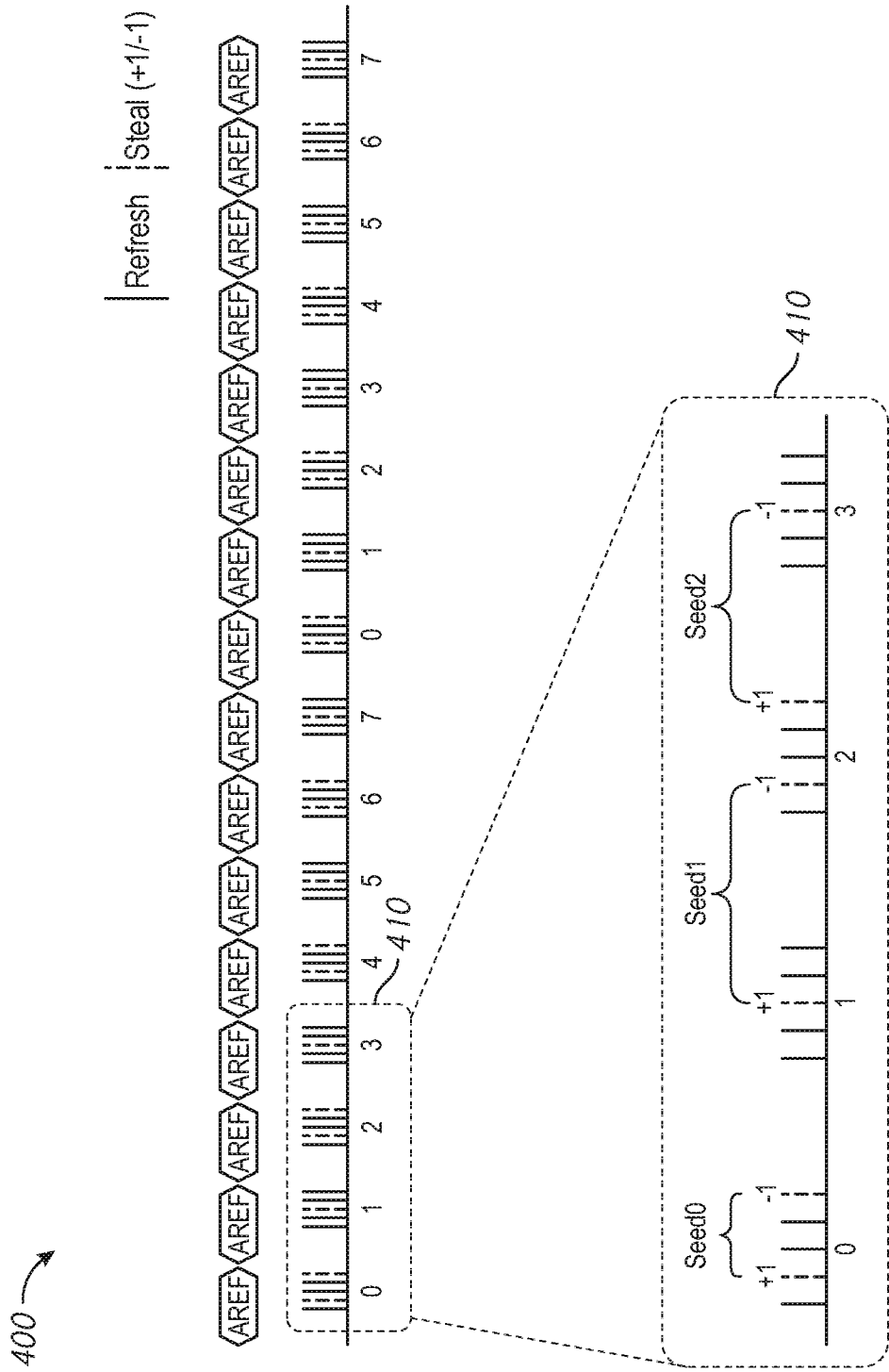
FIG. 4 shows a timing diagram of a refresh operations according to an embodiment of the present disclosure.

FIG. 4 shows a timing diagram of a refresh operations according to an embodiment of the present disclosure. The timing diagram 400 includes a portion 410, shown in greater detail for ease of explanation. The first line of the timing diagram 400 shows a refresh signal AREF, which is periodically activated during a refresh mode of the memory device. Each block along the first line may represent an activation of AREF. In some embodiments, AREF may be a binary signal, and an activation may represent a period where the value of the signal is raised from a first logical level (e.g., a low logical level) to a second logical level (e.g., a high logical level).

The second line of the timing diagram 400 shows a refresh pump signal. The vertical lines of the refresh pump signal may represent an activation of the refresh pump signal (e.g., as provided by pump generator 240 of FIG. 2). In some embodiments, the refresh pump signal may be a binary signal, and each activation may be a 'pulse' of the signal, where the signal is briefly changed to a different logical level (e.g., raised from a low logical level to a high logical level) and then returned to its original logical level (e.g., drops from a high logical level back to a low logical level). Each activation of the refresh signal AREF may be associated with a group of a number of activations of the refresh pump signal. As shown in the example embodiment of FIG. 4, there may be a group of five activations of the refresh pump signal for each activation of AREF. Each activation of the refresh pump may be associated with a refresh operation. The type of refresh operation may change (e.g., based on the signals provided by the sequence generator 246 of FIG. 2) based on internal logic of a refresh control circuit (e.g., refresh control circuit 116 of FIG. 1 and/or 200 of FIG. 2).

At least one pump in each group of pumps may be associated with a targeted refresh operation. In other words, responsive to each activation of the refresh signal AREF, there may be at least one targeted refresh operation. In some embodiments, the targeted refresh operation may be at different times within the group of pumps responsive to different activations of the refresh signal AREF. For example, in the embodiment shown in FIG. 4, the targeted refresh operations are on different pumps in groups of pumps based on even and odd activations of the refresh signal AREF.

In the embodiment of FIG. 4, the memory device may perform an auto-refresh operation and one type of targeted refresh operation. In the targeted refresh operation of FIG. 4, the memory may refresh two different victim wordlines associated with a given aggressor wordline, which may be the wordlines which are adjacent to the aggressor wordline (e.g., +1 and −1). A portion 410 of the timing diagram 400 is shown with expanded timing to show how targeted refresh operations may be distributed throughout the auto-refresh operations.

The memory device may perform a targeted refresh operation on the second and fifth refresh pumps of a first refresh signal activation, and perform a targeted refresh operation on the third refresh pump of a second refresh signal activation. This cycle may then repeat such that even numbered activations of AREF (starting with '0') have targeted refresh operations on the second and fifth pumps, while odd numbered activations of AREF have targeted refresh operations on the third pump. Accordingly, responsive to a first AREF, the memory may perform an auto-refresh operation, then a targeted refresh operation, then two auto-refresh operations, then a targeted refresh operation. Responsive to a next AREF, the memory may perform two auto-refresh operations, a targeted refresh operation, and then two auto-refresh operations.

In the embodiment of FIG. 4, the memory device may perform two targeted refresh operations on each identified aggressor address (e.g., one for the +1 address and one for the −1 address). The aggressor address may be referred to as a "seed," and each seed may have some number of victim addresses associated with it. For example, a given seed may have two associated addresses (e.g., +1 and −1) for two targeted refresh operations. The first seed. (Seed0) may have its associated victim addresses refreshed on the second and fifth pumps of the group of pumps associated with a first activation of the refresh signal. However, since there is only one targeted refresh operation during odd numbered activations of the refresh signal, the next seed (Seed1) may be split across the second and third activations of AREF. In particular the second seed (Seed1) may have a first victim address (e.g., +1) refresh on the third pump of the second group of pumps, and the second victim address (e.g., −1) may be refreshed on the second pump of the third group of pumps. The third seed (seed 2) may then begin on the fifth pump of the third group of pumps and finish on the third pump of the fourth group of pumps. The cycle may then repeat.

In this manner, a targeted refresh operations may be distributed throughout the refresh operations. Each group of pumps may include at least on targeted refresh operation. In the embodiment of FIG. 4, each targeted refresh operations may be separated by at least one auto-refresh operation. The pumps associated with the targeted refresh operation may change between different activations of AREF. For example, a targeted refresh operation may be separated from a next targeted refresh operation by either two or three auto-refresh operations.

Figure 5:
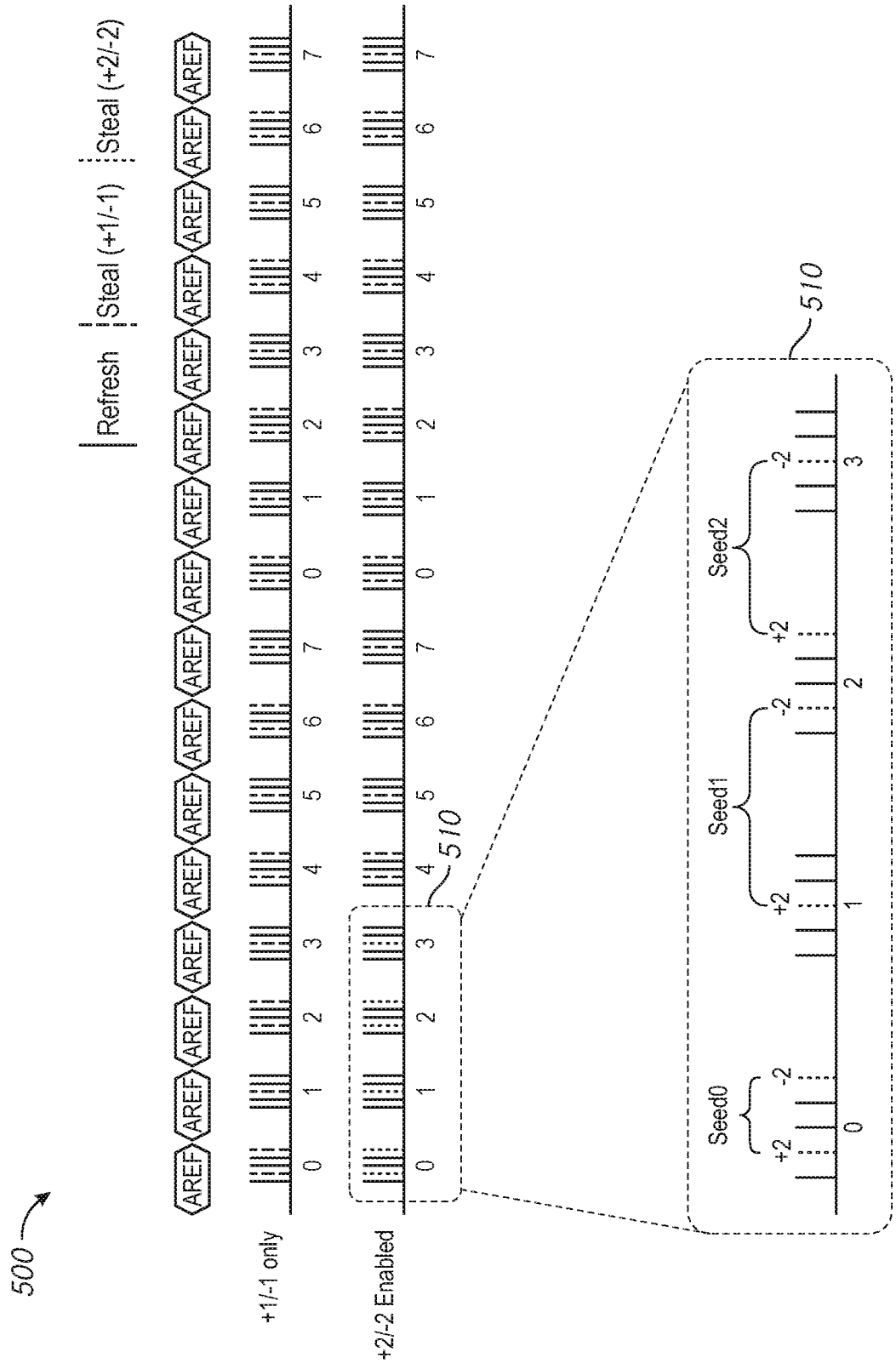
FIG. 5 shows a timing diagram of refresh operations according to an embodiment of the present disclosure.

FIG. 5 shows a timing diagram of refresh operations according to an embodiment of the present disclosure. The timing diagram 500 and portion 510 may generally be similar to the timing diagram of FIG. 4. However, in the embodiment of FIG. 5, the memory device may perform two different types of targeted refresh operations. In particular, the memory device may perform a second type of targeted refresh operation instead of the first type of targeted refresh operation during certain activations of the refresh signal AREF.

For the sake of brevity, operations and timing which are similar to those already described will not be repeated in regards to FIG. 5. The first line represents activations of the refresh signal AREF, while the second line represents refresh operations when the second type of targeted refresh operations are not enabled. The first and second line of the timing diagram 500 may generally be the same as the operations of the timing diagram 400 and portion 410 of FIG. 4. The third line of the timing diagram 500, as well as the expanded portion 510, represent a situation where the second type of targeted refresh operation are performed.

In the embodiment of FIG. 5, the memory device may perform the second type of targeted refresh operation instead of the first type of targeted refresh operation responsive to certain activations of AREF. In particular, the memory device may perform +2/−2 refresh operations responsive to the first four activations of AREF and then perform +1/−1 refresh operations responsive to the next twelve activations of AREF (e.g., by enabling +2/−2 En of FIG. 2 for 4 out of 16 AREFs).

In some embodiments, the activations of AREF may be counted (e.g., by command counter 242) up to a maximum value of 8 (e.g., the counter may run from 0 to 7). In that case, the counter may activate the second type of targeted refresh operation (e.g., by providing +2/−2 En) on the first four counts of every other cycle of counts.

The portion 510 shows the refresh operations during the first four activations of a cycle of 16 activations of AREF, when the second type of targeted refresh operation is enabled. Responsive to these activations of AREF, the memory device may refresh the +2 and −2 addresses with the same timing as the refreshing of the +1 and −1 addresses discussed in regards to FIG. 4. Accordingly, the second type of targeted refresh operation may be performed on the second and fifth pumps of a first AREF, and the third pump of a second AREF. Once four AREFs worth of refresh operations have been performed (which may include +2 and −2 addresses associated with 3 different aggressor addresses (e.g., 'seeds')), the memory may go back to performing the first type of targeted refresh operation for the next twelve activations of AREF.

Figure 6:
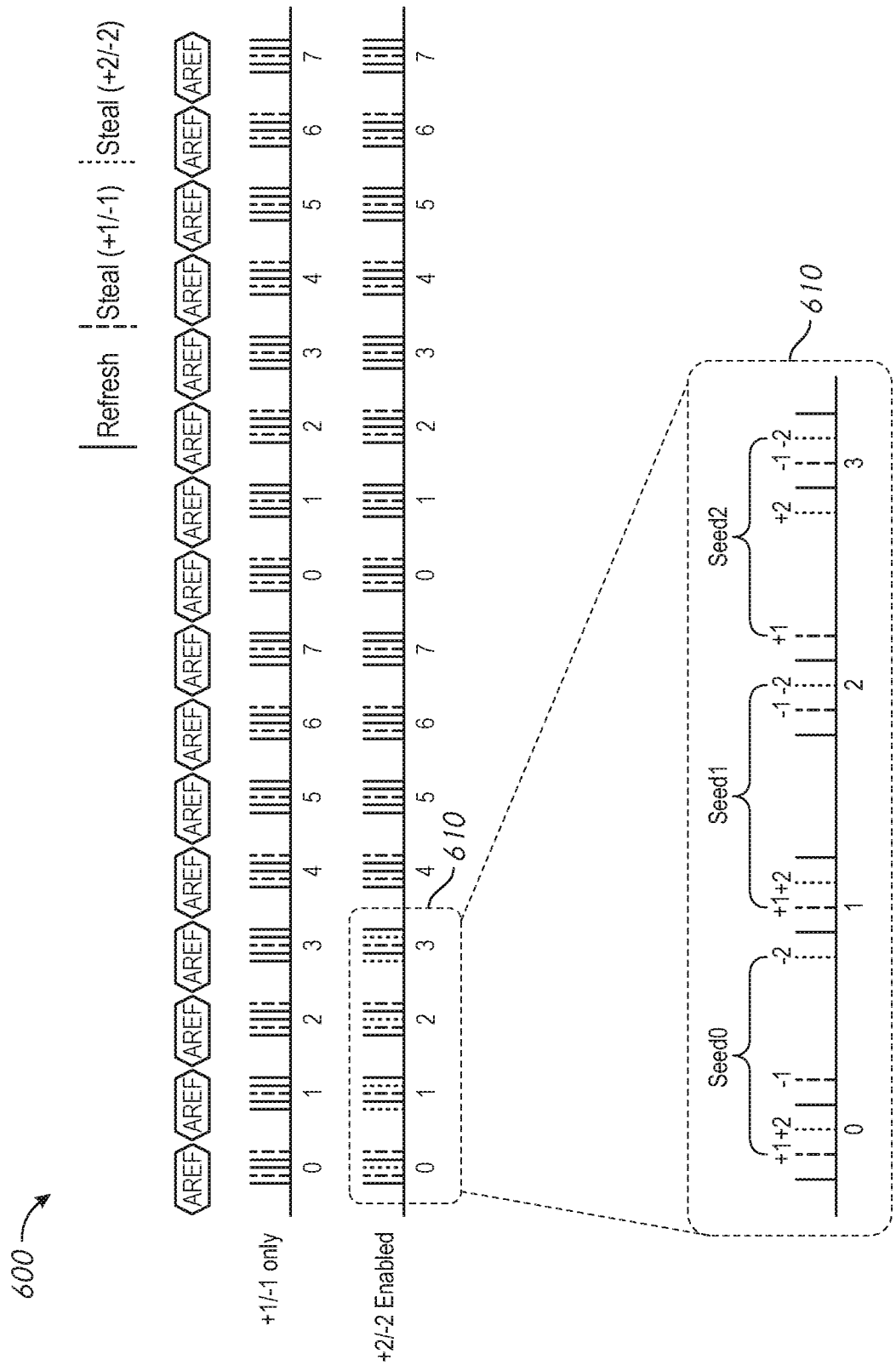
FIG. 6 shows a timing diagram of refresh operations according to an embodiment of the present disclosure.

FIG. 6 shows a timing diagram of refresh operations according to an embodiment of the present disclosure. The timing diagram 600 and portion 610 may be generally similar to the timing diagram 400 and portion 410 of FIG. 4 and the timing diagram 500 and portion 510 of FIG. 5. For the sake of brevity, features and operations previously described with not be repeated here. FIG. 6 differs from FIGS. 4 and 5 in that the timing diagram 600 shows an embodiment where the memory device performs the first type of targeted refresh operation and the second type of targeted refresh operation responsive to certain activations of AREF.

The first line of the timing diagram 600 shows activations of the refresh signal AREF. The second line shows refresh operations when the second type of targeted refresh operation is not enabled. The first two lines of the timing diagram 600 may generally be the same as the first two lines of the timing diagram 400 of FIG. 4 and the timing diagram 500 of FIG. 5. Similar to the embodiment discussed in FIG. 5, in the timing diagram 600, the third line (and the portion 610) represent refresh operations when the second type of targeted refresh operation is enabled. In the embodiment of FIG. 5, the first type of targeted refresh operation is replaced with the second type of targeted refresh operation, as previously described. However, FIG. 6 represents an embodiment where, for the first four activations of AREF, refresh pumps are used for auto-refresh operations, the first type of targeted refresh operation and the second type of targeted refresh operation.

The inset portion 610 shows refresh operations performed responsive to a first four activations of AREF out of a cycle of 16. These first four activations of AREF are associated with pumps which are used to perform auto-refresh operations, and the first and second type of targeted refresh operation (e.g., +1, −1, +2, and −2). The memory device may perform targeted refresh operations responsive to the same pump activations as in the embodiments of FIGS. 4 and 5, and may also perform targeted refresh operations on additional pumps. Accordingly, the memory device may perform targeted refresh operations on the second and fifth pumps of a first AREF activation, and the third pump of a second AREF activation and also perform targeted refresh operations on the third pump of the first AREF activation and on the first and fourth pump of the second AREF activation. Overall, the memory device may perform targeted refresh operations on the second, third and fifth pumps responsive to a first activation of AREF, and on the first, third, and fourth pumps responsive to a second activation of AREF.

Since both the first and second type of targeted refresh operation are being performed, each aggressor address may have four different targeted refresh operations (e.g., one on +1, −1, +2, and −2). In other words, each seed may correspond to four targeted refresh operations. Over four different activations of AREF, the victim rows associated with three different seeds may be refreshed. The memory device may perform a targeted refresh on the +1 address responsive to a first time there is a first type of targeted refresh operation, and then refresh −1 on the second time there is the first type of targeted refresh operation. The +2 and −2 addresses may be refreshed in a similar manner. Thus, in the embodiment of FIG. 6, the +1, +2, −1, and −2 addresses may be refreshed in that order. Other timings may be used in other embodiments.

The first seed (seed0) may be associated with targeted refresh operations on the second, third, and fifth pumps responsive to a first AREF activation, and a first pump responsive to a next activation of AREF. The second seed (seed1) may be associated with targeted refresh operations on the third and fourth pumps of the second AREF activation, and the second and third pumps of a third AREF activation. The third seed (seed2) may be associated with targeted refresh operations on the fifth pump of the third AREF activation, and the first, third, and fourth pump of a fourth AREF activation.

Figure 7:
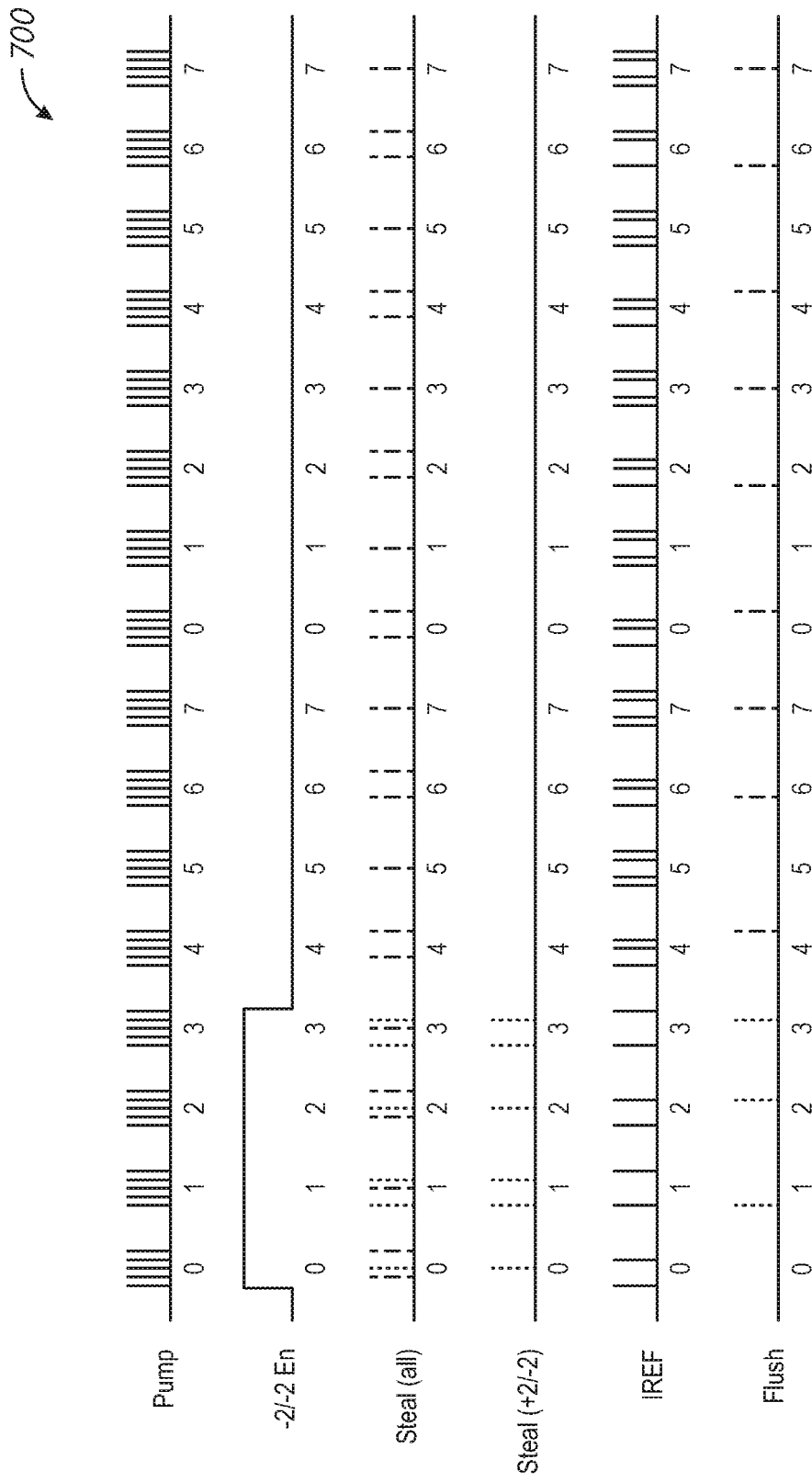
FIG. 7 shows a timing diagram of internal signals of a refresh control circuit according to an embodiment of the present disclosure.

FIG. 7 shows a timing diagram of internal signals of a refresh control circuit according to an embodiment of the present disclosure. The timing diagram 700 represents the internal signals of a refresh control circuit (e.g., the refresh control circuit 200 of FIG. 2) while performing refresh operations in a manner similar to the timing diagram 600 of FIG. 6.

The first line of the timing diagram 700 represents the refresh pump signal (e.g., as provided by the pump generator 240 of FIG. 2). The pump signal is activated five times in response to each activation of the refresh signal AREF (not shown). The second line of the timing diagram 700 shows the +2/−2 En signal (e.g., as provided by the command counter 242 of FIG. 2). The +2/−2 En signal may be at a high logical level to indicate that the second type of targeted refresh operation (e.g., refreshing the +2 and −2 addresses) should be performed. The signal +2/−2 En may be at a high logical level for the first four groups of pumps (e.g., the first four activations of AREF) and may then return to a low logical level for the next eight groups of pumps. Accordingly, both +1/−1 and +2/−2 targeted refresh operations may be performed during the first four groups of pumps.

The third, fourth, and fifth lines of the timing diagram 700 show the signals Steal(all), Steal(+2/−2), and IREF respectively. These signals may be provided by a sequence generator (e.g., sequence generator 246) and may determine if a given activation of the refresh pump signal is used for an auto-refresh operation, a first type of targeted refresh operation (e.g., +1 and −1) or a second type of targeted refresh operation (e.g., +2 and −2), When REF is active, neither Steal(all) nor Steal(+2/−2) are active, the memory device may perform an auto-refresh operation. Steal(all) may be provided when any type of targeted refresh operation is performed, while Steal(+2/−2) may be provided to indicate that the second type of targeted refresh operation should be performed.

Accordingly, at a first pump, only IREF is active, and thus an auto-refresh operation may be associated with the first pump. At a second pump, only Steal(all) is active, and the first type of targeted refresh operation may be performed. At the third pump, both Steal(all) and Steal(+2/−2) are active, so the second type of targeted refresh operation may be performed. At the fourth pump, IREF is active again, so another auto-refresh operation may be performed. At the fifth pump, only Steal(all) is active, so the first type of targeted refresh operation may be performed. In this manner, the sequence generator may distribute the different types of targeted refresh operation by selectively providing IREF, Steal(all), and Steal(+2/−2) each time the pump signal is provided.

The sixth line of the timing diagram 700 shows the signal Flush, which may be provided by a sampler control circuit (e.g., sampler control circuit 236 of FIG. 2) to indicate that targeted refresh operations for a given aggressor address have been completed and that a new aggressor address should be provided (e.g., by address sampler 234). While +2/−2 En is active, Flush may be provided each fourth activation of Steal(all) (or each second activation of Steal (+2/−2)). When +2/−2 En is not active, Flush may be provided every other time that Steal(all) is provided.

Of course, it is to be appreciated that any one of the examples, embodiments or processes described herein may be combined with one or more other examples, embodiments and/or processes or be separated and/or performed amongst separate devices or device portions in accordance with the present systems, devices and methods. For instance, in each of embodiments shown in FIGS. 4, 5 and 6, one refresh signal always causes at least one targeted refresh operation. In some embodiments, one refresh signal may not always cause at least one targeted refresh operation.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
a memory array comprising a plurality of wordlines;
an interface configured to perform access operations on the plurality of wordlines and configured to provide activations of a refresh signal;
a refresh control circuit configured to determine if a wordline is an aggressor wordline based on the access operations, and further configured to refresh a first victim wordline associated with the aggressor wordline and refresh a second victim wordline associated with the aggressor wordline, wherein at least one other wordline is refreshed between refreshing the first victim wordline and refreshing the second victim wordline, wherein responsive to an activation of the refresh signal, the refresh control circuit is further configured to provide a plurality of activations of a refresh pump signal, and wherein at least one wordline is refreshed with each activation of the refresh pump signal.

2. The apparatus of claim 1, wherein the first victim wordline and the second victim wordline are adjacent to the aggressor wordline.

3. The apparatus of claim 1, wherein the first victim wordline is refreshed on an activation of the refresh pump signal associated with a first activation of the refresh signal, and wherein the second victim wordline is refreshed on an activation of the refresh pump signal associated with a second activation of the refresh signal.

4. The apparatus of claim 1, wherein responsive to counting a certain number of the activations of the refresh signal, the refresh address control circuit is further configured to refresh a third victim wordline instead of the first victim wordline and refresh a fourth victim wordline instead of the second victim wordline.

5. The apparatus of claim 4, wherein the first victim wordline is between the third victim wordline and the aggressor wordline, and wherein the second victim wordline is between the fourth victim wordline and the aggressor wordline.

* * * * *